(12) United States Patent
Jen et al.

(10) Patent No.: US 11,665,879 B2
(45) Date of Patent: May 30, 2023

(54) METHOD OF MANUFACTURING DYNAMIC RANDOM-ACCESS MEMORY

(71) Applicant: Winbond Electronics Corp., Taichung (TW)

(72) Inventors: Kai Jen, Taichung (TW); Hao-Chuan Chang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/864,411

(22) Filed: Jul. 14, 2022

(65) Prior Publication Data

US 2022/0344342 A1 Oct. 27, 2022

Related U.S. Application Data

(62) Division of application No. 16/924,235, filed on Jul. 9, 2020, now Pat. No. 11,430,792.

(30) Foreign Application Priority Data

Jul. 12, 2019 (TW) .................................. 108124717

(51) Int. Cl.
  *H01L 21/74* (2006.01)
  *H01L 29/78* (2006.01)
  *H01L 29/66* (2006.01)

(52) U.S. Cl.
  CPC ....... *H10B 12/02* (2023.02); *H01L 29/66666* (2013.01); *H01L 29/7827* (2013.01);
  (Continued)

(58) Field of Classification Search
  CPC .............. H10B 12/315; H10B 12/0335; H10B 12/05; H10B 12/482; H10B 12/488; H10B 12/02; H10B 12/01; H10B 12/30; H10B 12/31; H10B 12/09; H01L 29/66666; H01L 29/7827; H01L 21/743; H01L 21/823885; H01L 21/76229; H01L 21/28506; H01L 27/10814; H01L 27/10855;
  (Continued)

(56) References Cited

U.S. PATENT DOCUMENTS 7,586,149 B2 * 9/2009 Yoon ...................... H10B 12/09
  257/329
9,837,422 B2 * 12/2017 Kim ....................... H10B 12/03
  (Continued)

*Primary Examiner* — Shouxiang Hu
(74) *Attorney, Agent, or Firm* — JCIPRNET

(57) ABSTRACT

A method of manufacturing a DRAM includes proving a substrate having active regions. First bit line structures are buried in the substrate. Each of first bit line structures extends along a first direction. Every two of the first bit line structures are disposed between two neighboring ones of the active regions arranged along a second direction. A plurality of pillar structures are formed arranged along the first direction by dividing each of the active regions. Second bit line structures are formed. Each of the second bit line structures is located between the pillar structures of a corresponding one of the active regions and extends through the corresponding one of the active regions along the second direction to be disposed on the first bit line structures at two sides of the corresponding one of the active regions and be electrically connected to the first bit line structures below.

17 Claims, 18 Drawing Sheets

(52) U.S. Cl.
CPC ......... *H10B 12/01* (2023.02); *H10B 12/0335* (2023.02); *H10B 12/05* (2023.02); *H10B 12/09* (2023.02); *H10B 12/315* (2023.02); *H10B 12/482* (2023.02); *H10B 12/488* (2023.02)

(58) Field of Classification Search
CPC ......... H01L 27/10885; H01L 27/10891; H01L 27/10873; H01L 27/2454; H01L 27/10805; H01L 27/10808
See application file for complete search history.

(56) References Cited

U.S. PATENT DOCUMENTS

| | | | |
|---|---|---|---|
| 10,199,497 B2 * | 2/2019 | Cho | H10B 12/053 |
| 10,410,912 B2 * | 9/2019 | Sukekawa | H01L 21/76256 |
| 2002/0109176 A1 * | 8/2002 | Forbes | H10B 12/053 |
| | | | 438/242 |
| 2011/0073925 A1 * | 3/2011 | Park | H01L 21/28518 |
| | | | 257/306 |

* cited by examiner

METHOD OF MANUFACTURING DYNAMIC RANDOM-ACCESS MEMORY

CROSS-REFERENCE TO RELATED APPLICATION

This application is a divisional application of and claims the priority benefit of U.S. application Ser. No. 16/924,235, filed on Jul. 9, 2020, which claims the priority benefit of Taiwan application serial no. 108124717, filed on Jul. 12, 2019. The entirety of the above-mentioned patent application is hereby incorporated by reference herein and made a part of this specification.

BACKGROUND OF THE INVENTION

Field of the Invention

The invention relates to a memory and a method of manufacturing the same, and more particularly, to a dynamic random-access memory and a method of manufacturing the same.

Description of Related Art

The current stacked dynamic random-access memory (DRAM) in which capacitors are stacked on top of a transistor, may achieve the object of high memory density. However, in the current DRAM, only a partial region of the active region is generally used as a capacitor landing region, and as the process size is continuously reduced, the area where the capacitor is landed is also reduced, thereby reducing the performance of the memory. Therefore, there is a need in the industry for a DRAM that may also have a larger capacitor landing area while the size of the memory is reduced.

SUMMARY OF THE INVENTION

The invention provides a DRAM that may have a larger capacitor landing area while the size of the memory is reduced, thereby improving the performance thereof.

A DRAM of the invention includes a substrate, a plurality of first bit line structures, a plurality of second bit line structures, and a plurality of word line structures. The substrate has a plurality of active regions. Each of the active regions includes a plurality of pillar structures arranged along a first direction. A plurality of first bit line structures are buried in the substrate. Each of the first bit line structures is extended along the first direction. There are two first bit line structures between the plurality of active regions arranged along a second direction. Each of the second bit line structures is located between the plurality of pillar structures of one of the plurality of active regions. Each of the second bit line structures is extended through one of the plurality of active regions along the second direction to be disposed on the plurality of first bit line structures at two sides of one of the plurality of active regions and be electrically connected to the plurality of first bit lines below. The plurality of word line structures are disposed on and spaced apart from the plurality of second bit line structures. Each of the word line structures is located between the plurality of pillar structures of one of the plurality of active regions and extended along the second direction through the plurality of active regions arranged along the second direction.

The invention provides a method of manufacturing a DRAM, the steps of which are as follows. A plurality of first shallow trenches and a plurality of deep trenches are formed in a substrate to define a plurality of active regions. Each of the deep trenches is extended along a first direction, and each of the first shallow trenches is extended along a second direction. A plurality of first bit line structures are formed in the plurality of deep trenches. A plurality of second shallow trenches are formed in the plurality of active regions, such that each of the active regions includes a plurality of pillar structures located at two sides of each of the second shallow trenches. The plurality of second shallow trenches and the plurality of first shallow trenches are alternately arranged along the first direction. A plurality of second bit line structures are formed in the plurality of second shallow trenches. Each of the second bit line structures is electrically connected to the plurality of first bit line structures at two sides of one of the plurality of active regions. A plurality of word line structures are formed on the plurality of second bit line structures. The plurality of word line structures are spaced apart from the plurality of second bit line structures.

Based on the above, the DRAM of the invention may achieve a cell size of $4F^2$, and via the configuration of the plurality of pillar structures, the first bit line structures, the second bit line structures, and the word line structures of each active region, the capacitor landing area may be increased, so that a larger capacitor landing area may be achieved while the size of the memory is reduced, thereby improving the performance thereof. In addition, forming the first doped regions and the second doped region at two sides of the word line structures may reduce electric field strength and gate-induced drain leakage current, thus improving the reliability of the DRAM.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
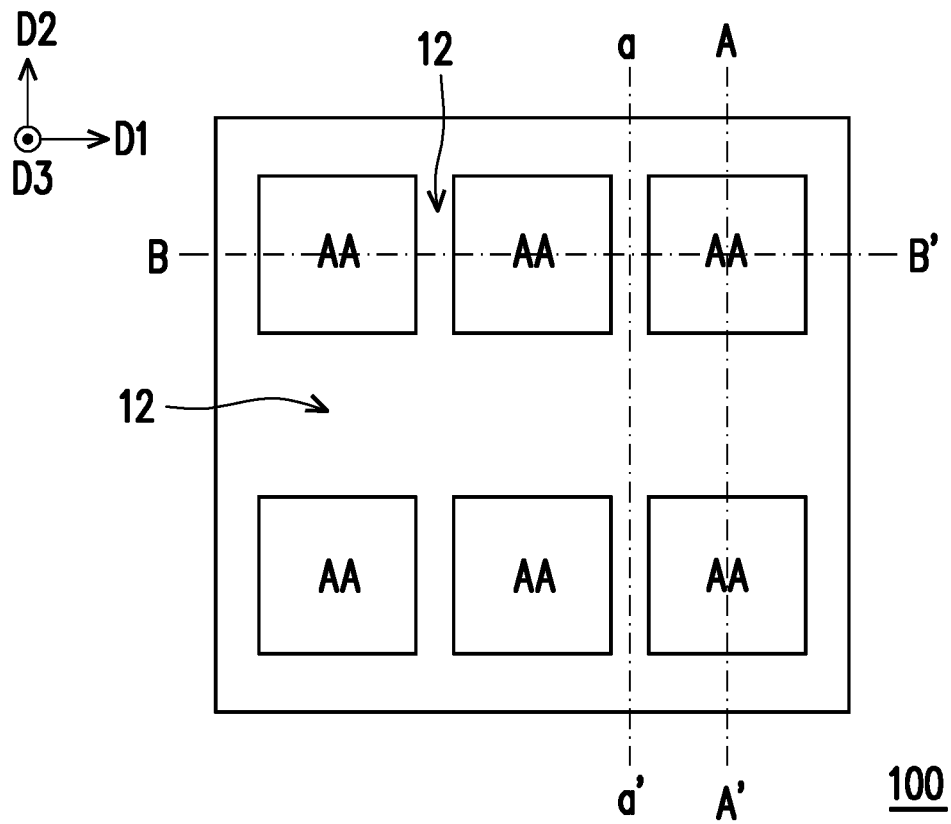
FIG. 1A to FIG. 1I are top views of a manufacturing process of a DRAM according to an embodiment of the invention.
Figure 2A:
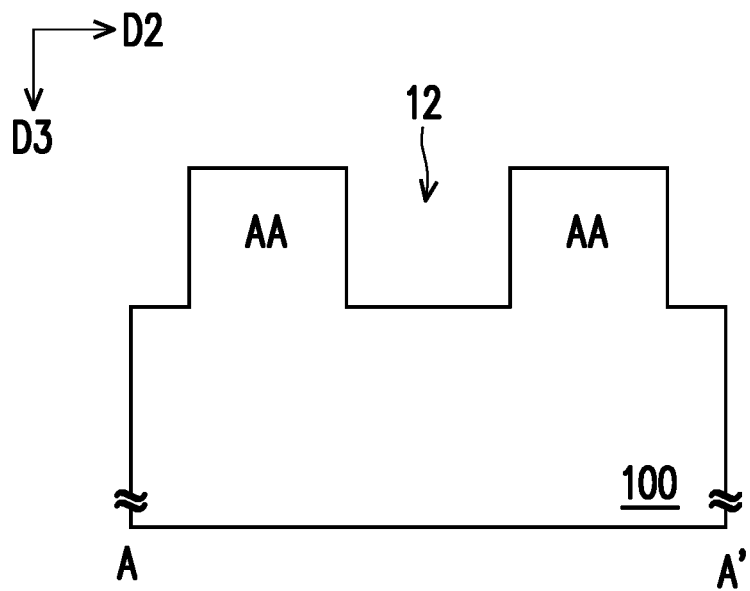
FIG. 2A to FIG. 2I are cross sections along line A-A' of FIG. 1A to FIG. 1I.
Figure 1B:
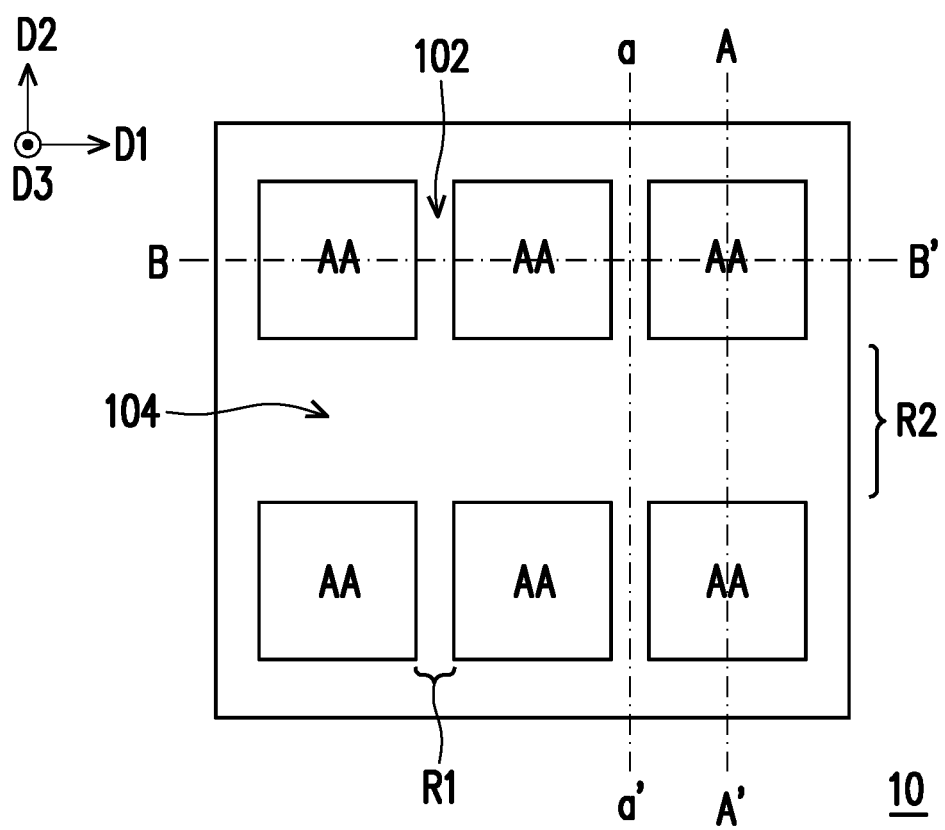
Figure 2B:
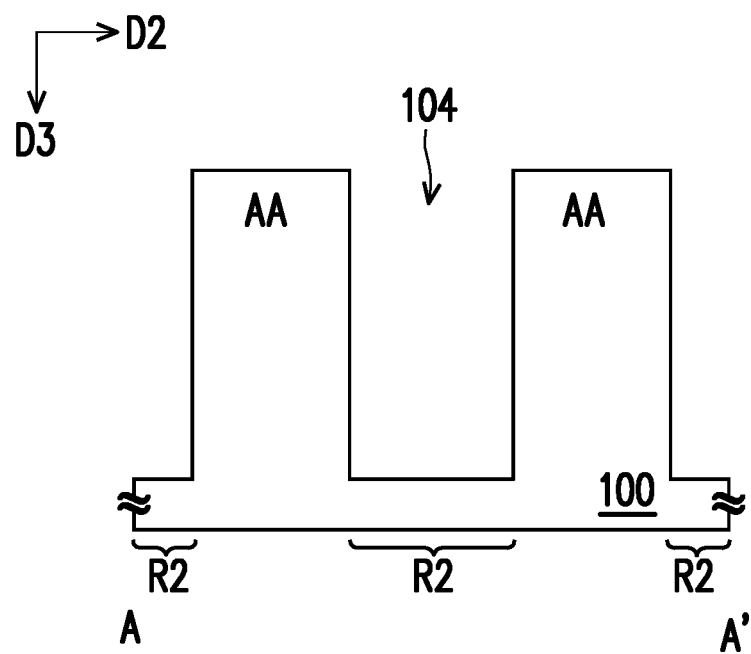
Figure 1C:
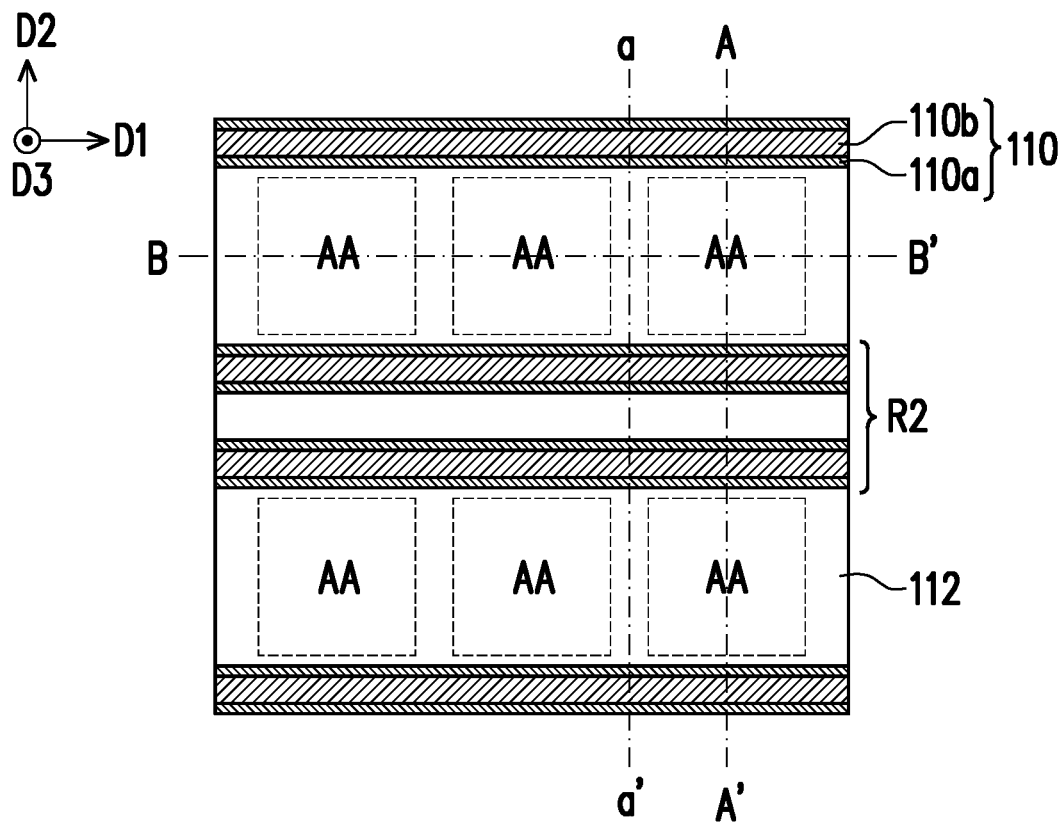
Figure 2C:
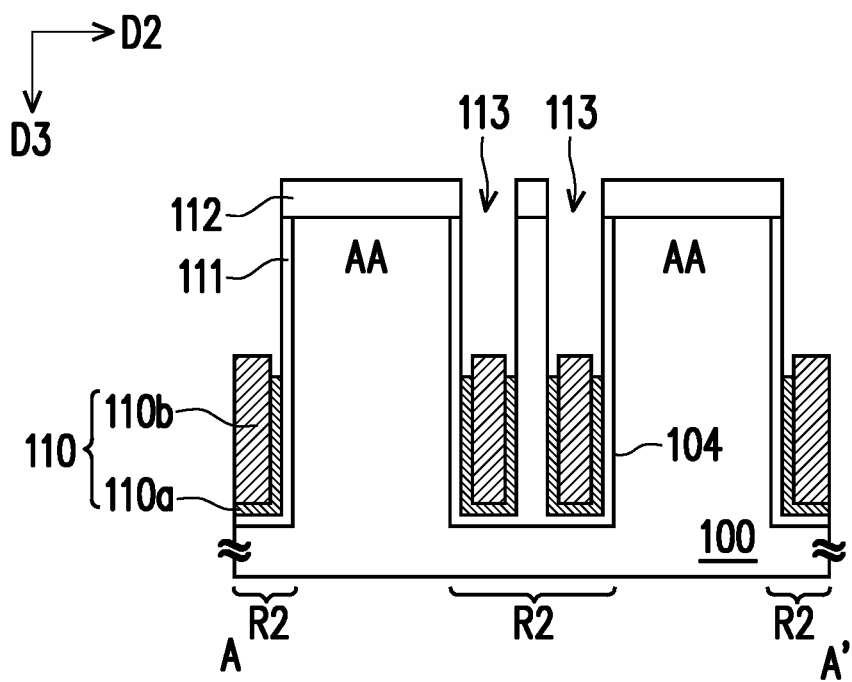
Figure 1D:
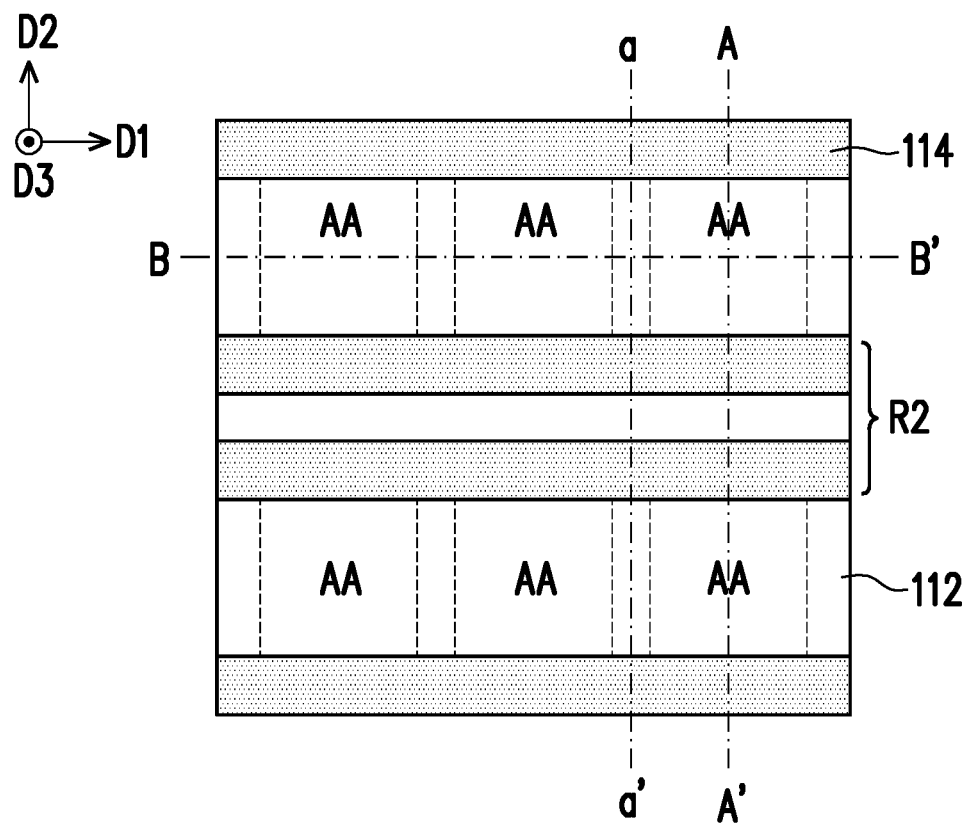
Figure 2D:
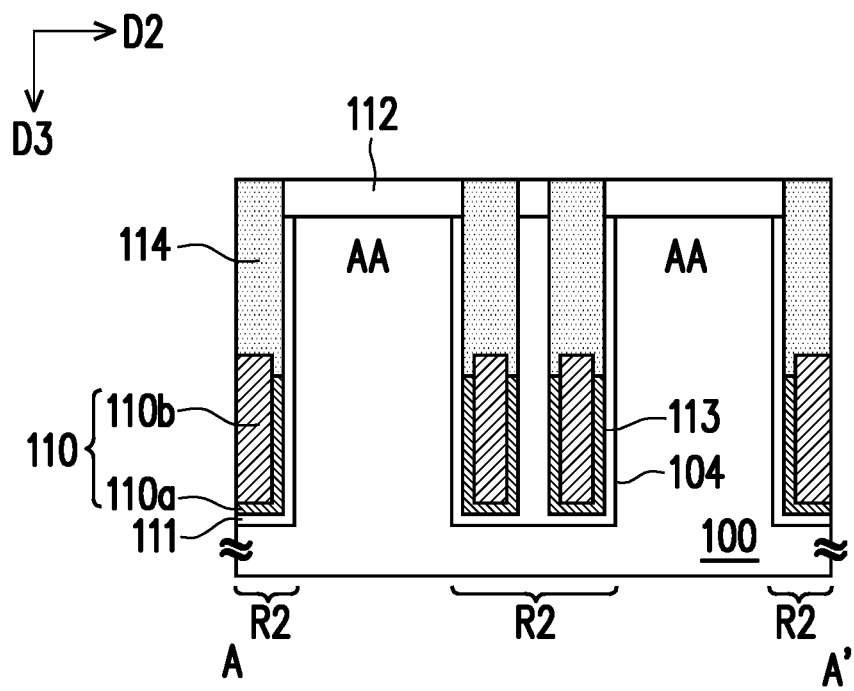
Figure 1E:
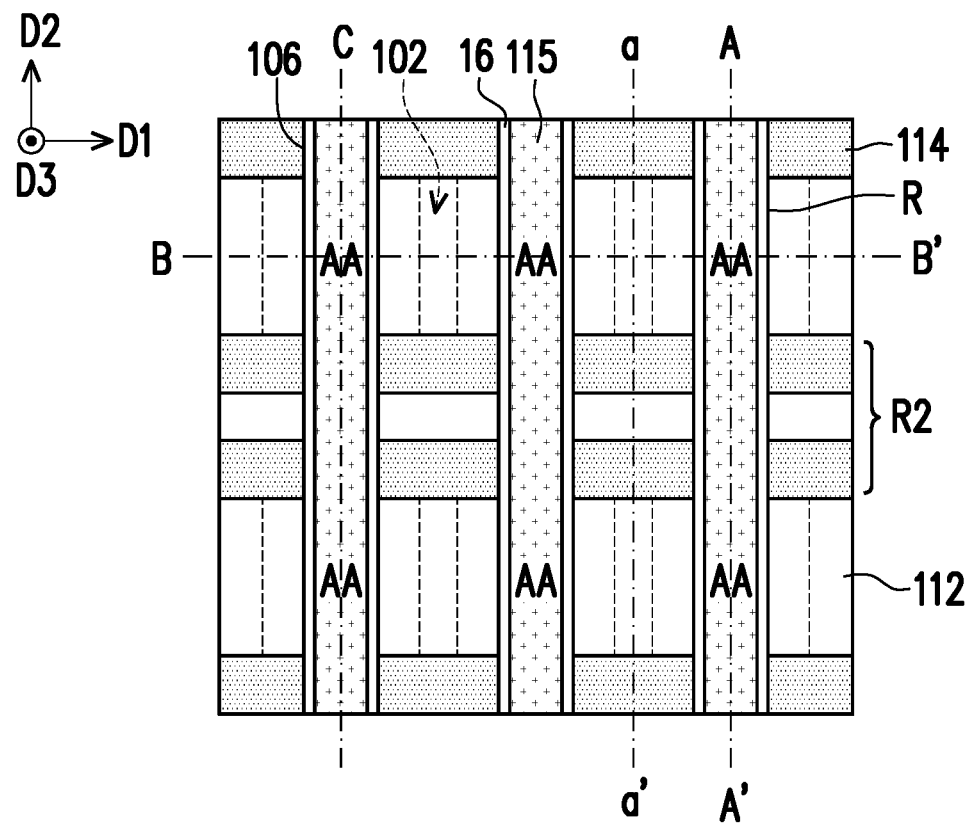
Figure 2E:
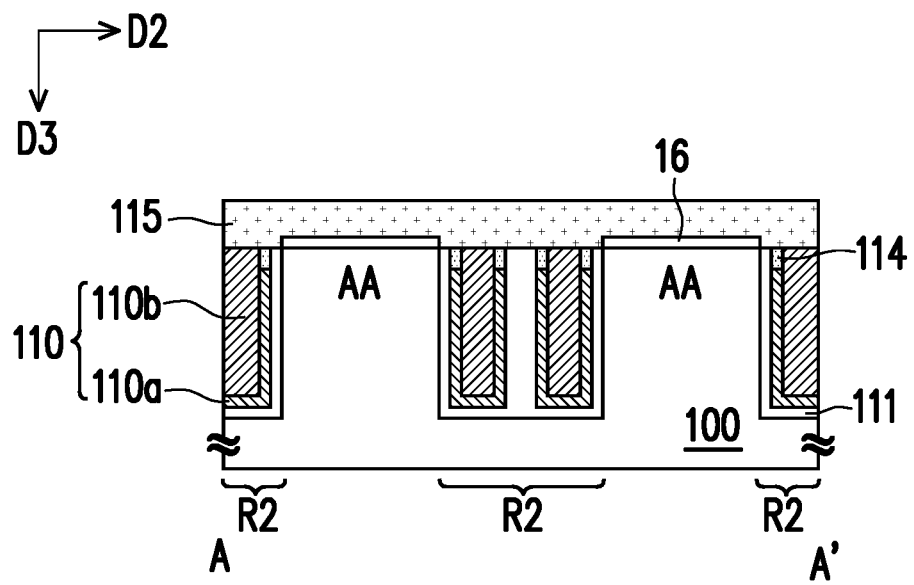
Figure 1F:
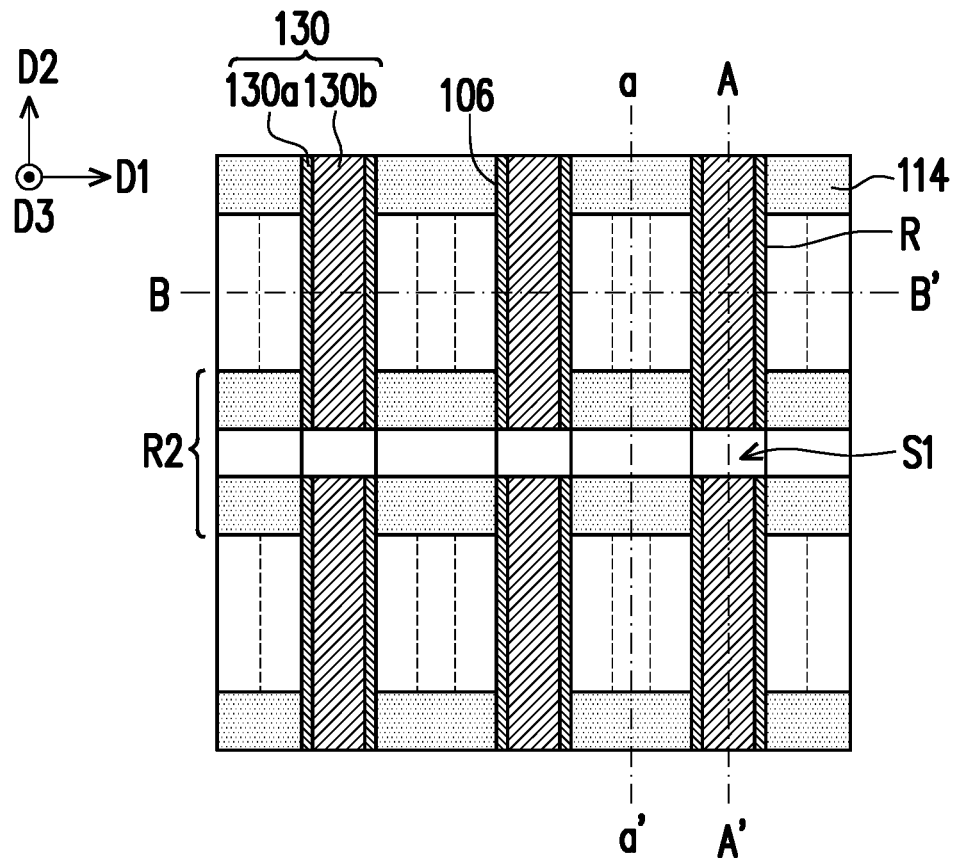
Figure 2F:
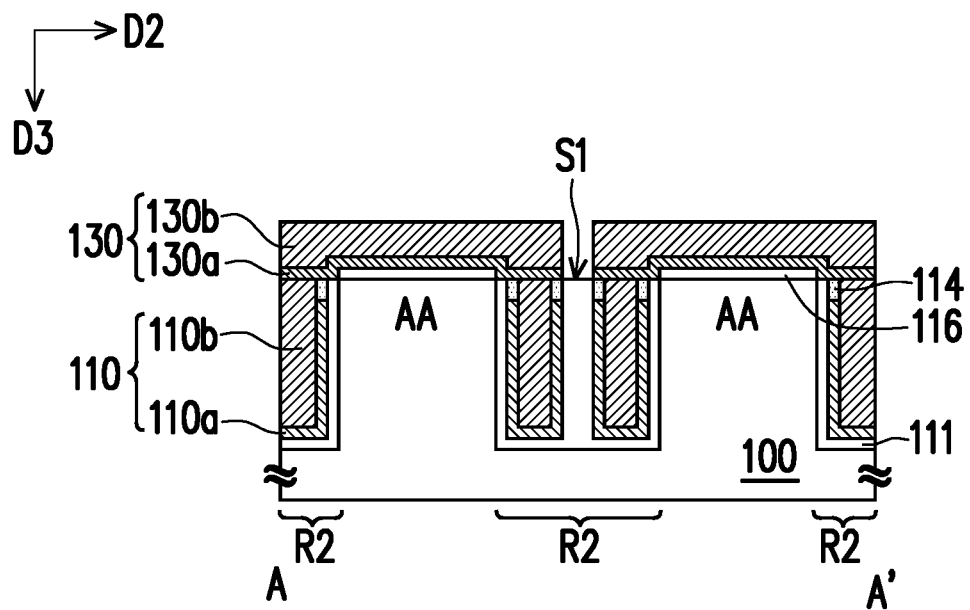
Figure 1G:
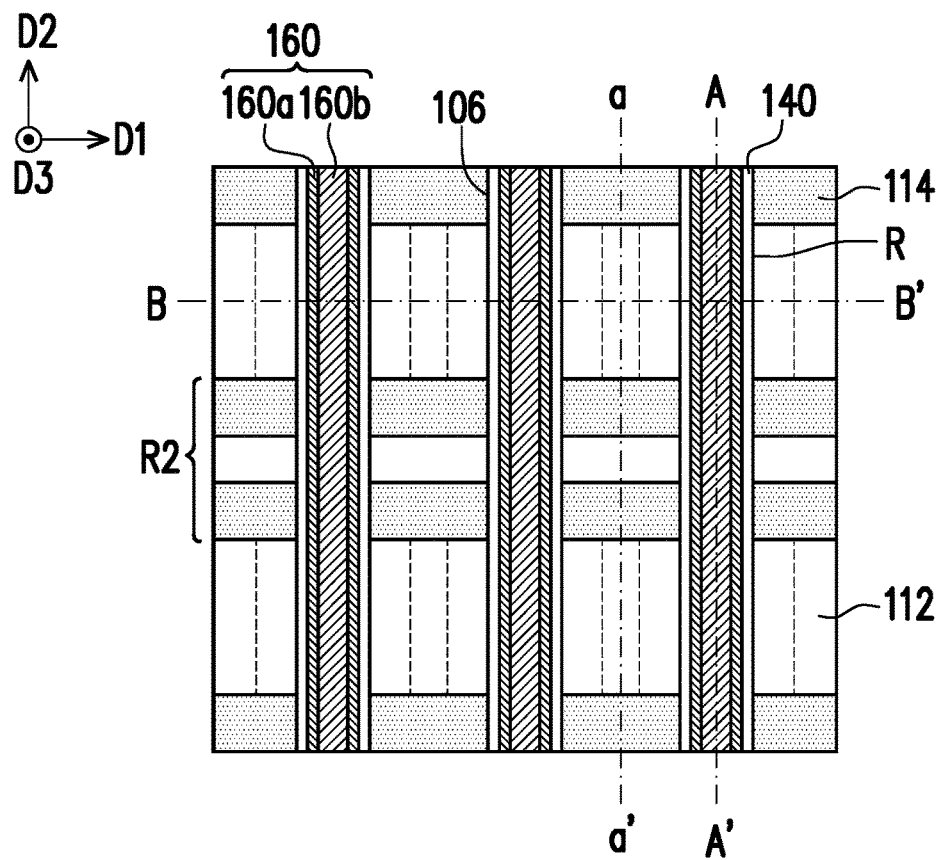
Figure 2G:
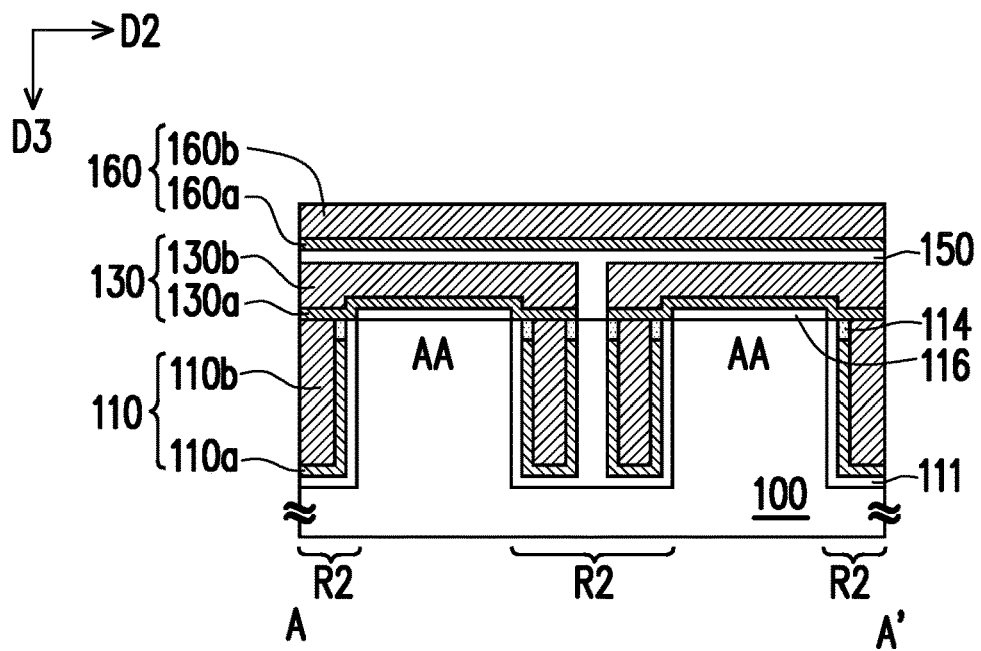
Figure 1H:
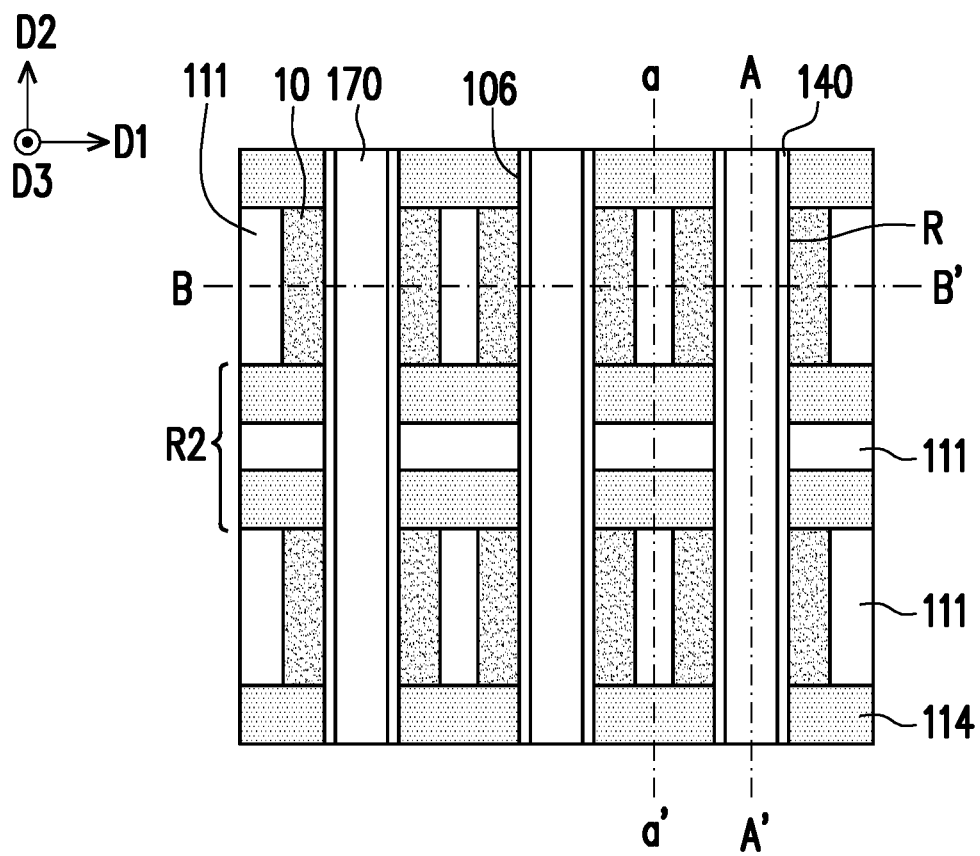
Figure 2H:
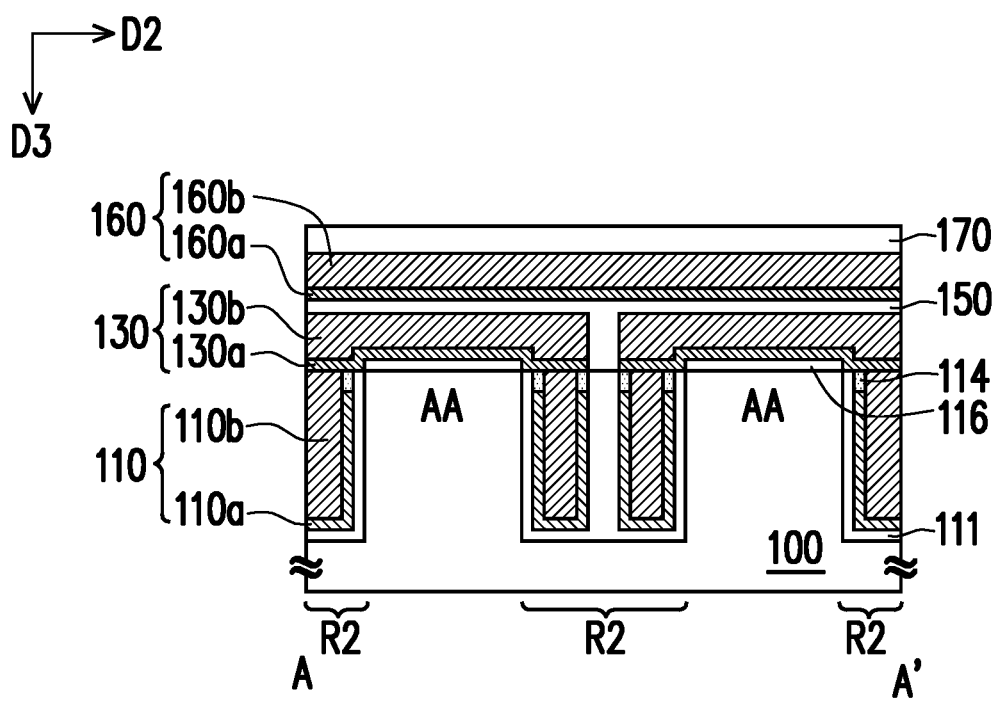
Figure 1I:
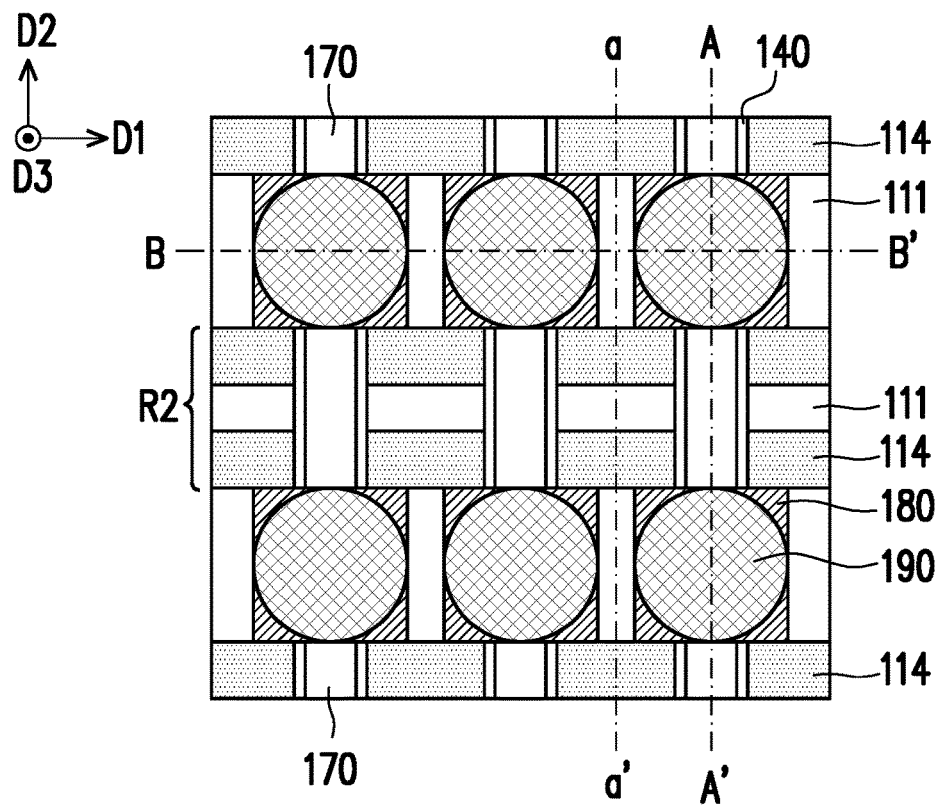
Figure 2I:
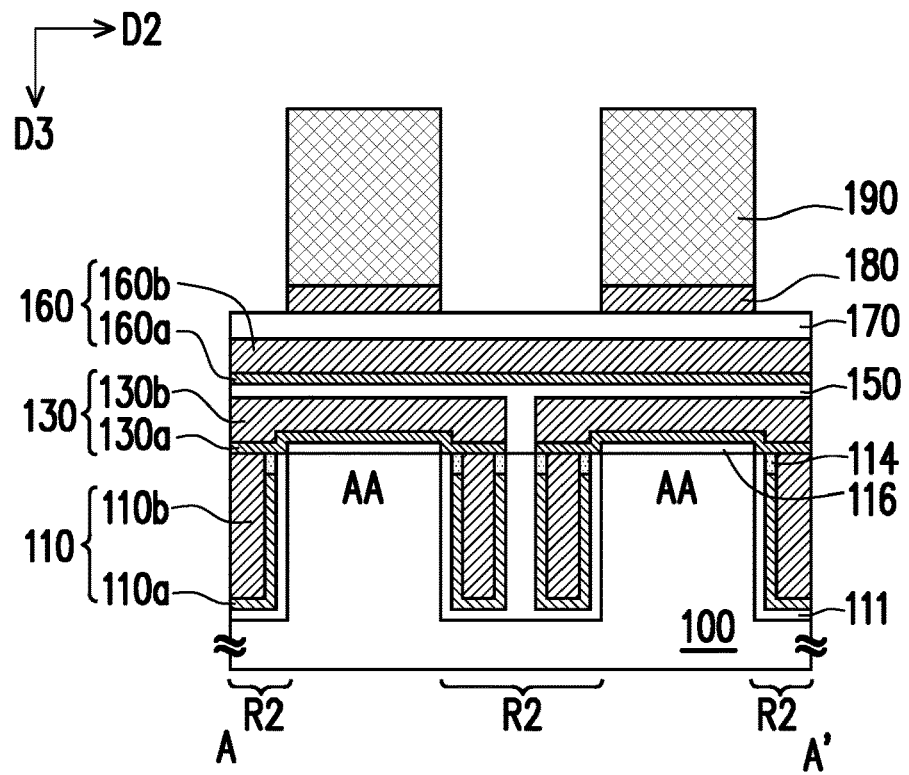
Figure 3A:
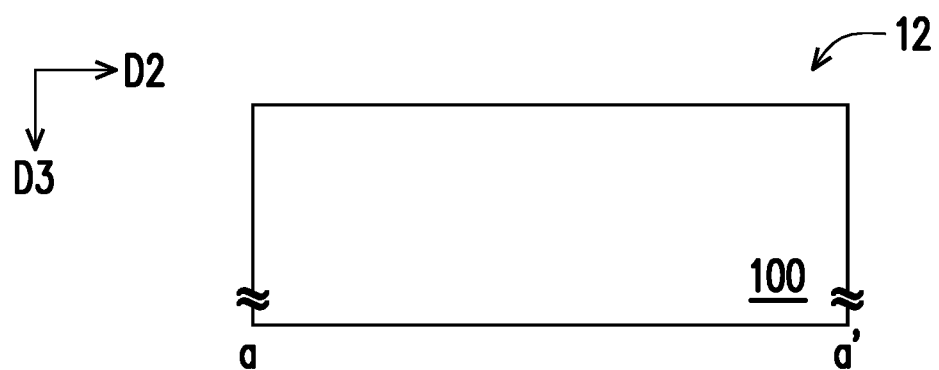
FIG. 3A to FIG. 3I are cross sections along line a-a' of FIG. 1A to FIG. 1I.
Figure 4A:
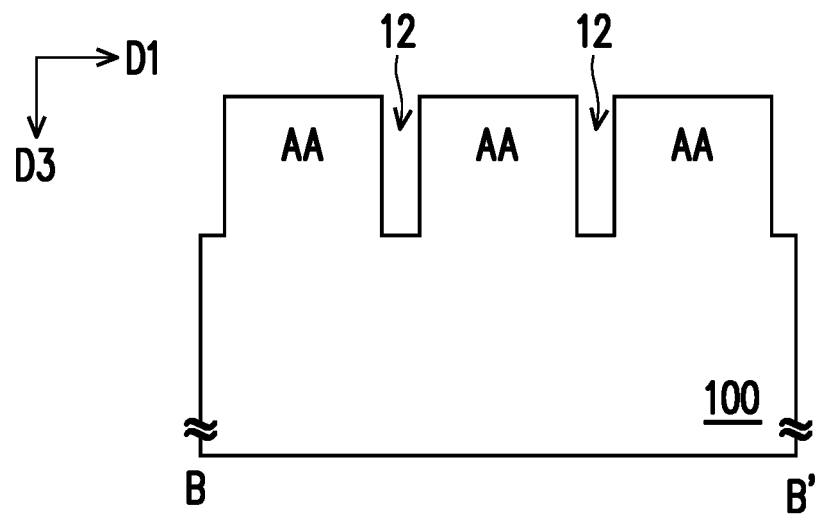
FIG. 4A to FIG. 4I are cross sections along line B-B' of FIG. 1A to FIG. 1I.
Figure 3B:
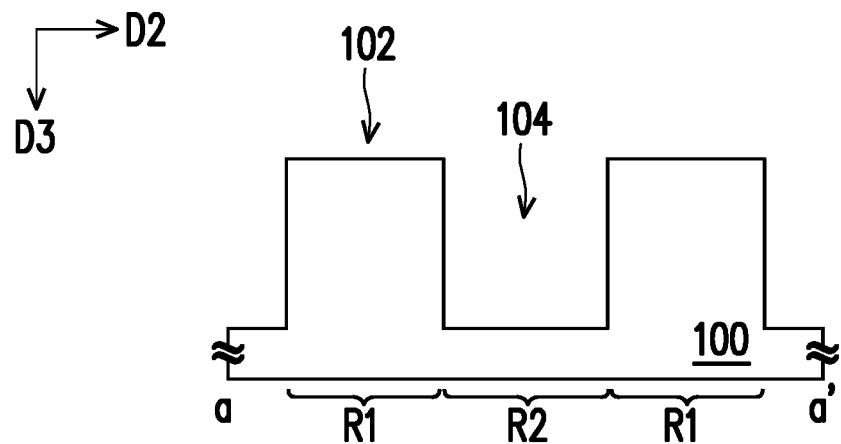
Figure 4B:
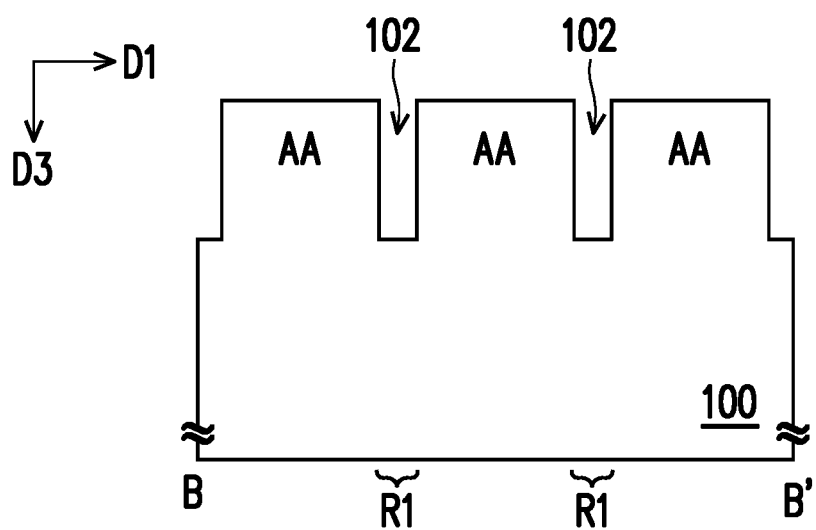
Figure 3C:
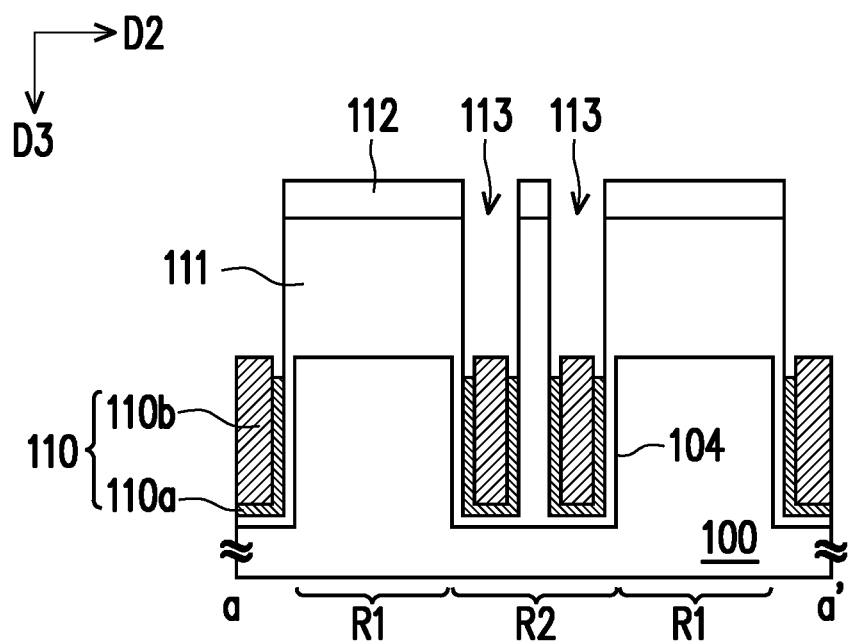
Figure 4C:
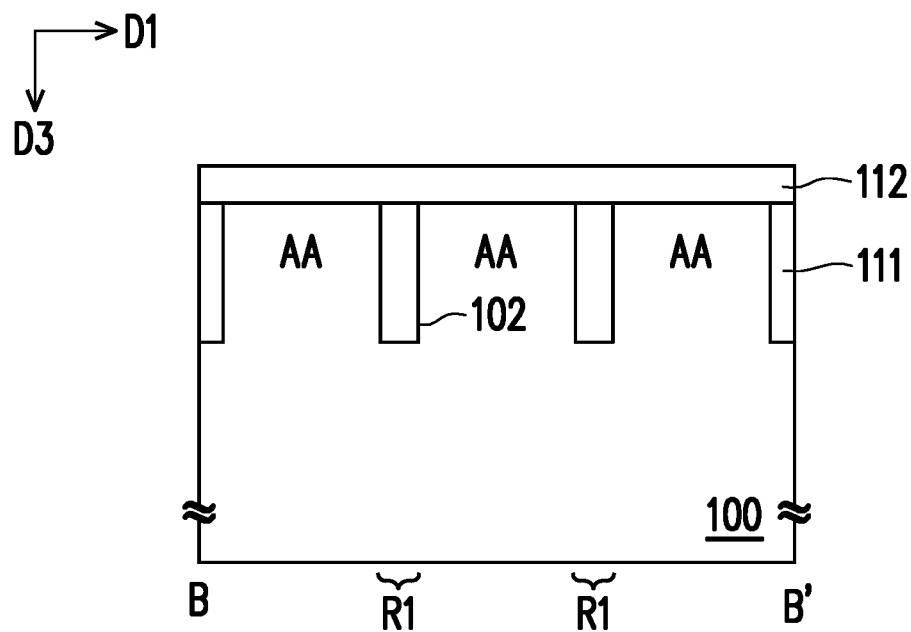
Figure 3D:
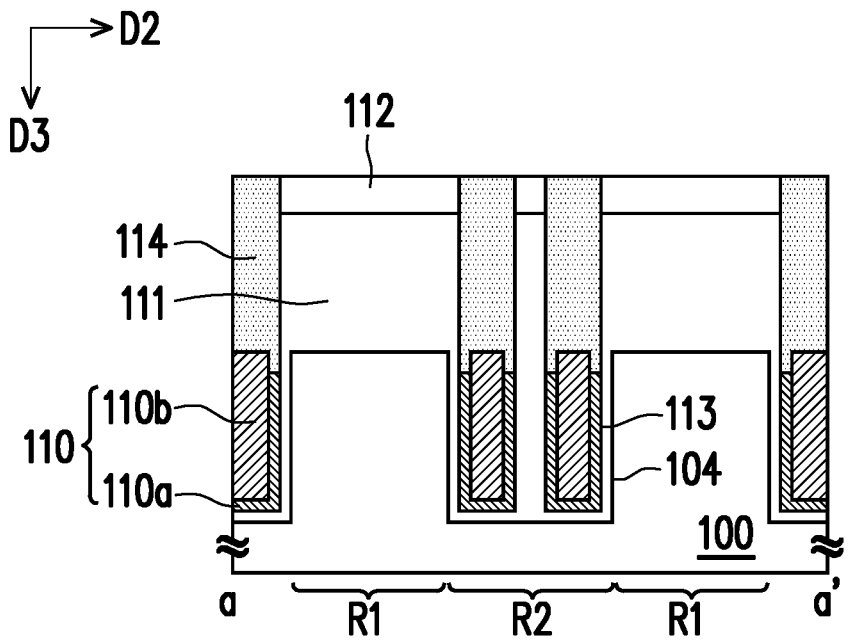
Figure 4D:
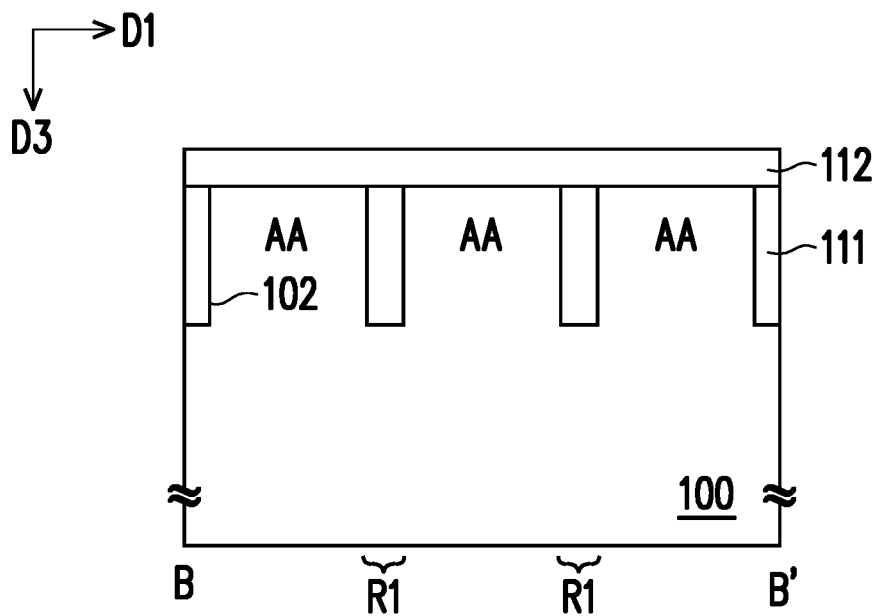
Figure 3E:
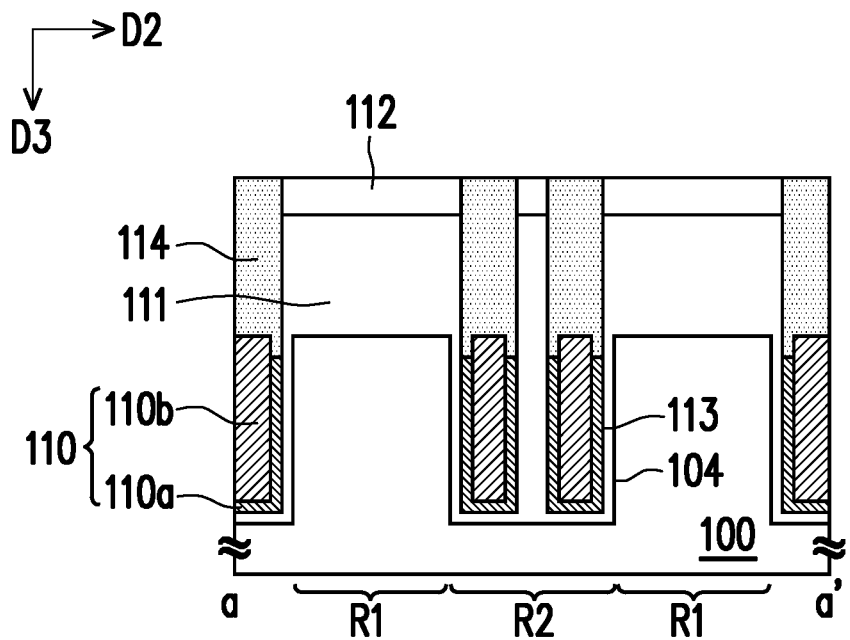
Figure 4E:
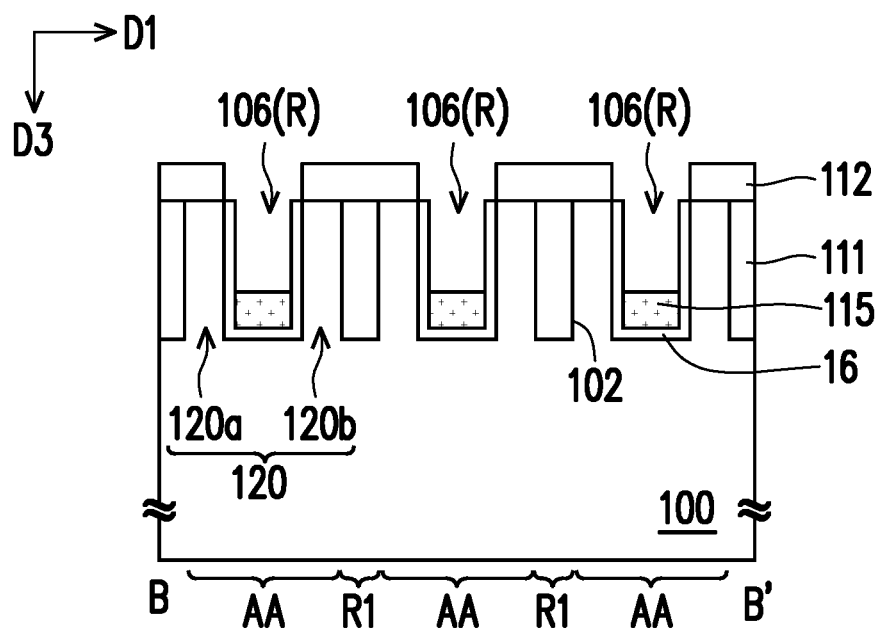
Figure 3F:
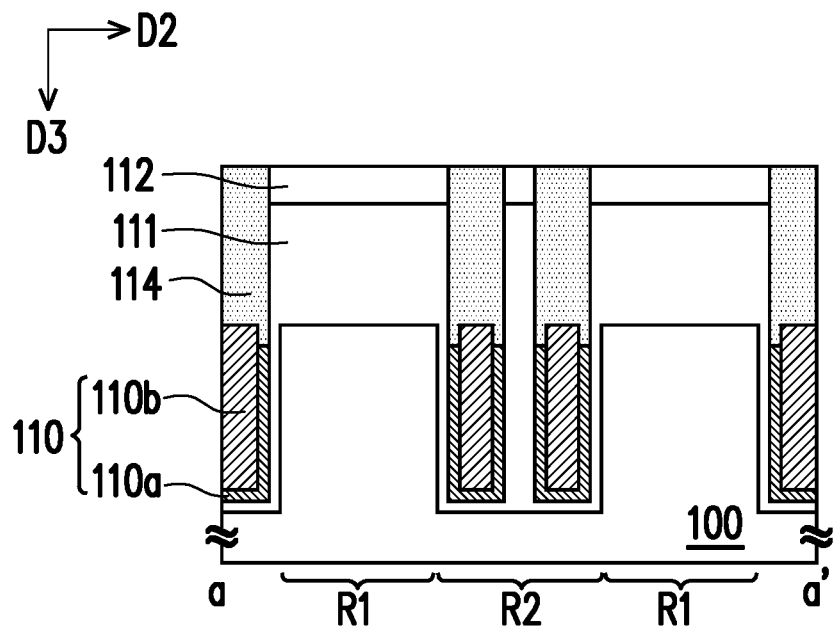
Figure 4F:
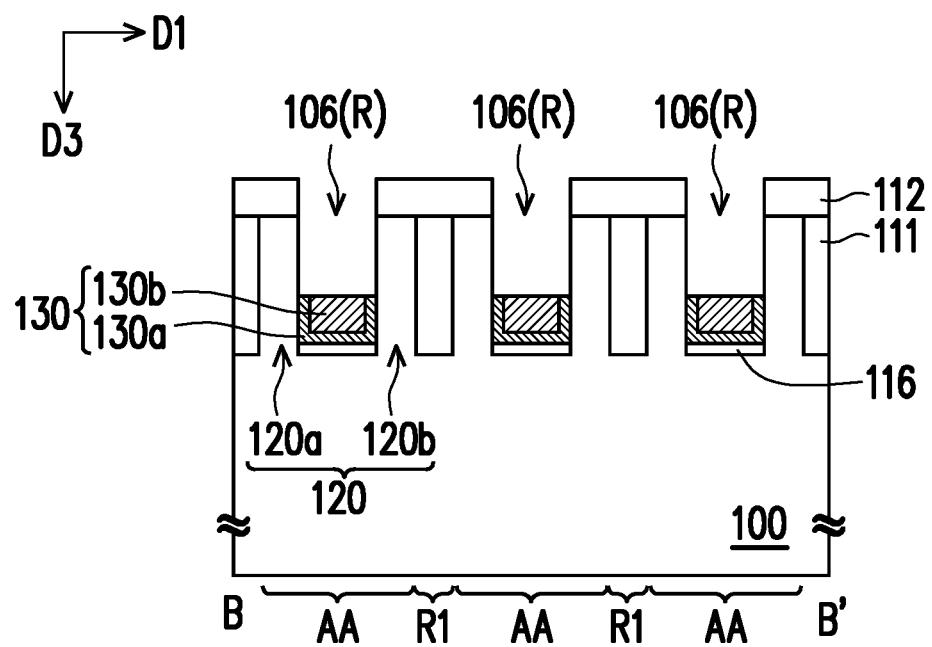
Figure 3G:
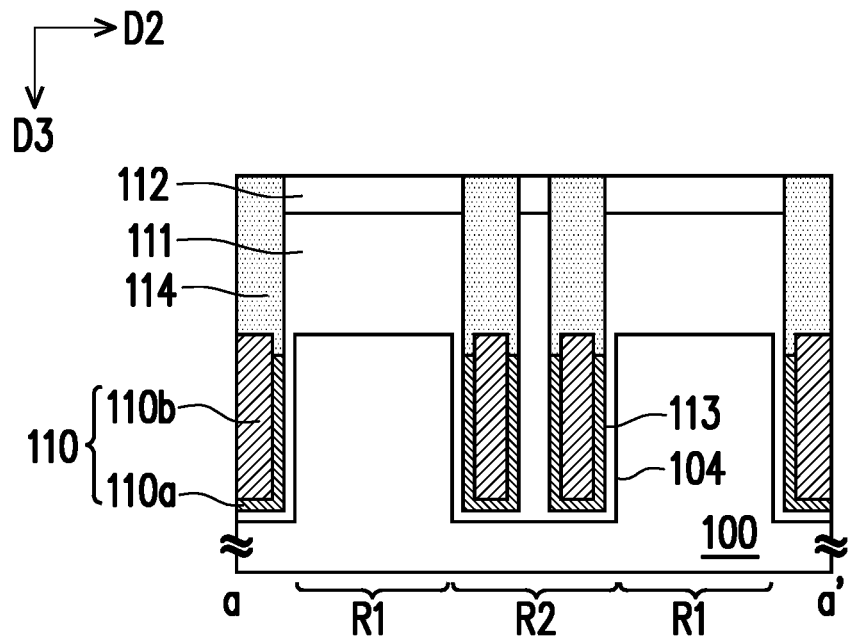
Figure 4G:
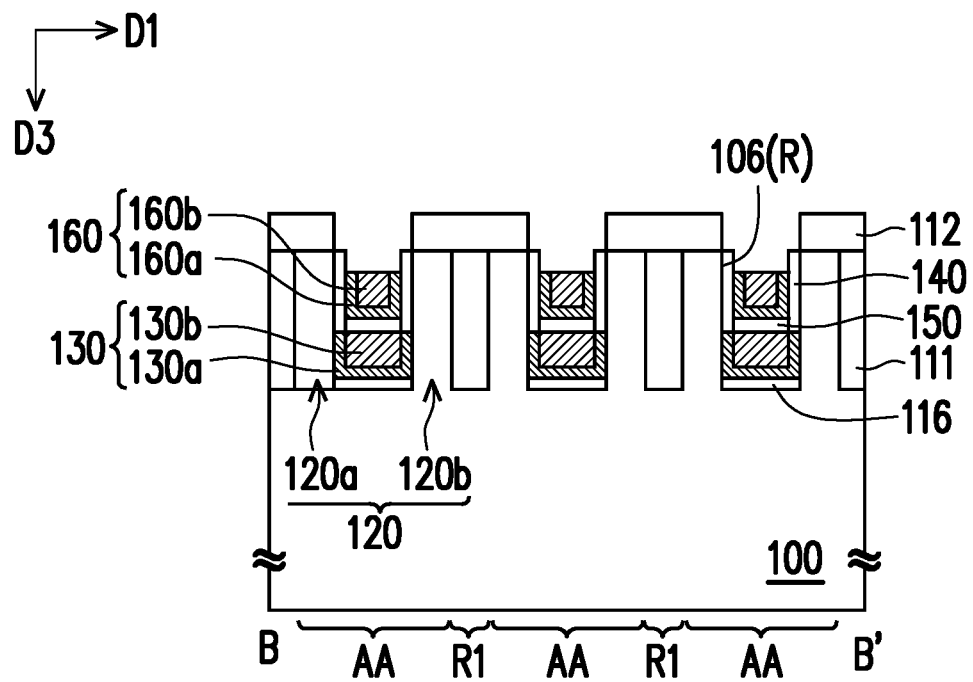
Figure 3H:
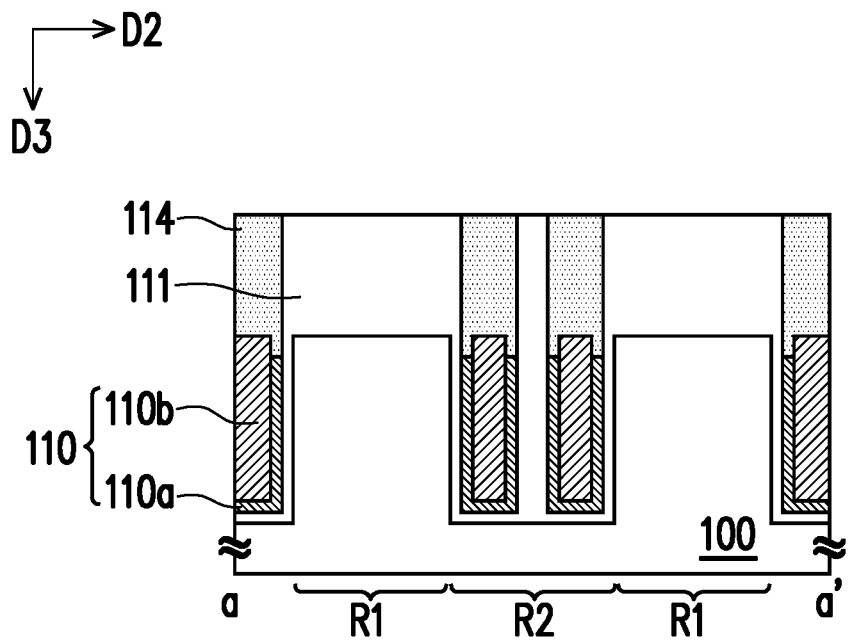
Figure 4H:
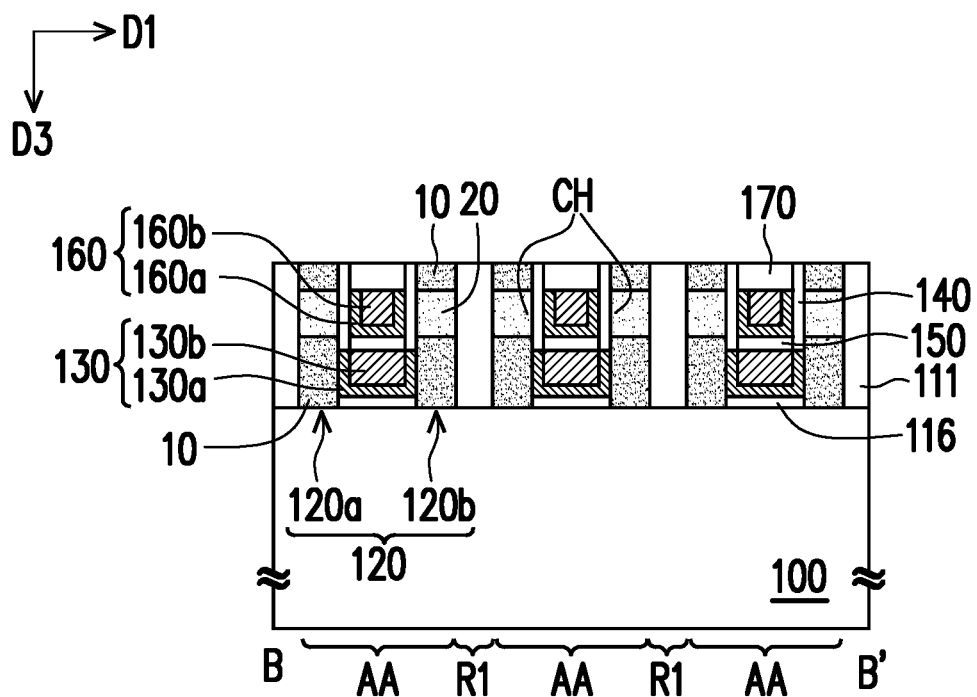
Figure 3I:
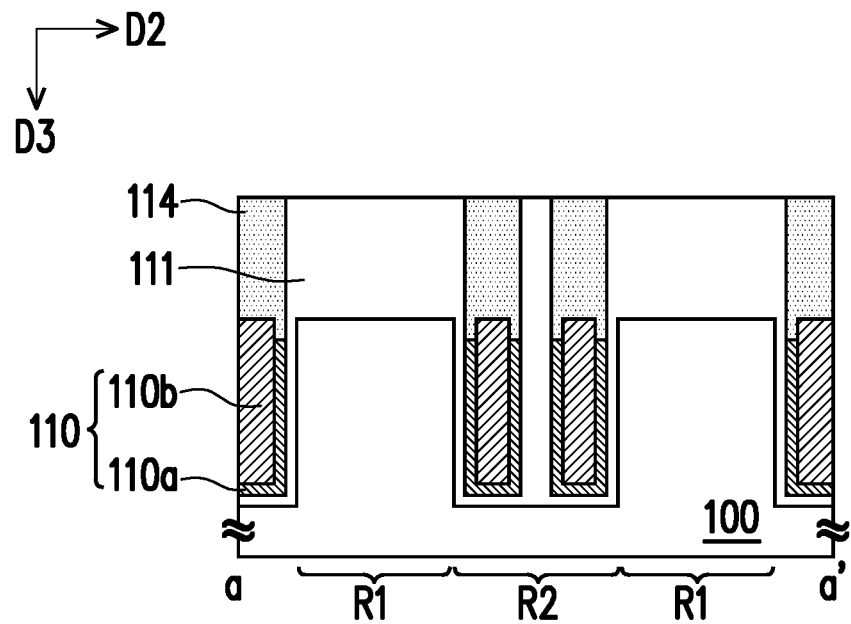
Figure 4I:
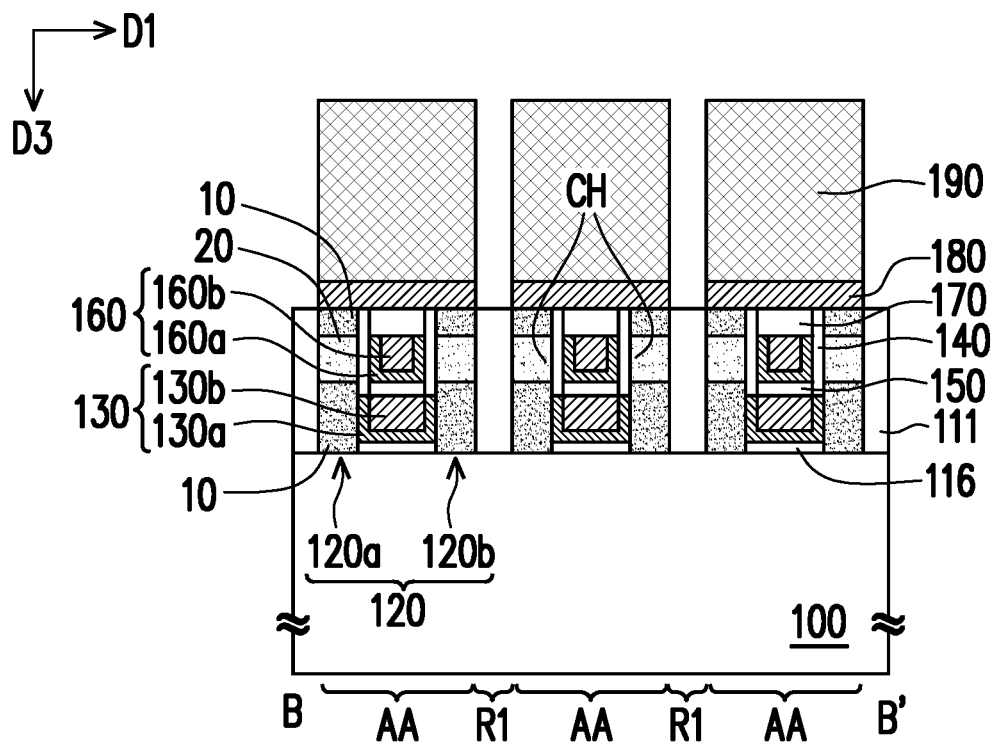

Referring to FIGS. 1A to 4A, a substrate 100 is provided. The substrate 100 is, for example, a semiconductor substrate such as a silicon substrate. Next, a plurality of trenches 12 are formed in the substrate 100, thereby a plurality of active regions AA separated by the trenches 12 are defined in the substrate 100. The plurality of active regions AA may be arranged in an array according to a first direction D1 (also referred to as a row direction) and a second direction D2 (also referred to as a column direction). The second direction D2 and the first direction D1 may be perpendicular to each other, but the invention is not limited thereto.

Referring next to FIGS. 1B to 4B, after the plurality of trenches 12 are formed, a partial removal process is performed to partially remove the substrate 100 of region R2 between two adjacent row of active regions AA to form deep trenches 104 having a depth greater than that of the trenches 12. The depth of the trenches 12 located in region R1 is not changed after the partial removal process, therefore the trenches 12 located in region R1 are also referred to as first shallow trenches 102. In some embodiments, the steps of the partial removal process are illustrated as follows. A dielectric material layer (not shown) is blanketly formed on the substrate 100. Namely, the dielectric material layer is simultaneously formed in the plurality of trenches 12 and on the surface of the plurality of active regions AA to form a flat surface on the substrate 100. The material of the dielectric material layer is, for example, spin-on carbon (SOC). Next, a patterned mask layer (not shown) is formed on the dielectric material layer. The patterned mask layer is extended along the first direction D1 and covers a plurality of active regions AA of the same row and the region R1 located between two adjacent active regions AA, and exposes the region R2 between two adjacent rows of the active regions AA. Next, the substrate 100 of the exposed region R2 is etched by using the patterned mask layer as a mask. Then, the patterned mask layer and the dielectric material layer are removed.

After the partial removal process is performed, the plurality of first shallow trenches 102 and the plurality of deep trenches 104 are formed in the substrate 100. The deep trenches 104 are extended along the first direction D1, the first shallow trenches 102 are extended along the second direction D2, and two adjacent deep trenches 104 and two adjacent first shallow trenches 102 define one active region AA.

Referring to FIGS. 1C to 4C, insulating layers 111 and 112 are formed on the substrate 100. The steps of forming the insulating layers 111 and 112 are illustrated as follows. First, the first shallow trenches 102 and the deep trenches 104 are filled with a first insulating material layer (not shown). The material of the first insulating material layer is, for example, silicon oxide, and the forming method thereof includes chemical vapor deposition (CVD). Next, a second insulating material layer may be formed on the first insulating material layer. The material of the second insulating material layer and the material of the first insulating material layer may be oxides formed in different ways. The material of the second insulating material layer is, for example, tetraethylorthosilicate (TEOS), but the invention is not limited thereto. Then, a lithography and etching process is performed to pattern the first insulating material layer and the second insulating material layer to form the insulating layer 111 and the insulating layer 112, and to form a plurality of grooves 113 in each of the deep trenches 104. These grooves 113 are extended along the first direction D1 and arranged along the second direction D2. The sidewalls of the grooves 113 expose the insulating layers 112 and 111; the bottom of the grooves 113 exposes the insulating layer 111.

Thereafter, first bit line structures 110 are formed in the grooves 113. The first bit line structures 110 may be single layer or multilayer structures. In some embodiments, the first bit line structures 110 include a barrier layer 110a and a conductive layer 110b. The barrier layer 110a may also be referred to as an adhesive layer. The material of the barrier layer 110a is, for example, metal or metal nitride such as titanium, tantalum, titanium nitride, tantalum nitride, or a combination thereof. The material of the conductive layer 110b is, for example, metal or metal alloy such as tungsten, aluminum, copper, or copper aluminum alloy. In some embodiments, the conductive layer 110b may adopt only metal or metal alloy and not contain metal silicide. The method of forming the barrier layer 110a and the conductive layer 110b is, for example, CVD or physical vapor deposition. The method of forming the first bit line structures 110 is, for example, forming a barrier material layer and a conductive material layer in the plurality of grooves 113. Next, the conductive material layer and the barrier material layer are etched back to form a plurality of first bit line structures 110 buried in the substrate 100. In the present embodiment, the first bit line structures 110 may be formed by deposition and etchback without using photoresist and lithography processes.

The first bit line structures 110 are located at two sides of each row of the active regions AA. The first bit line structures 110 are extended along the first direction D1 and arranged along the second direction D2. In some embodiments, the deep trenches 104 of the region R2 include two first bit line structures 110, but the invention is not limited thereto. In some embodiments, the top surface of the first bit line structures 110 in the region R2 is lower than the top surface of the substrate 100 of the active region AA. Further, in the region R2, two adjacent first bit line structures 110 are separated by the insulating layer 111.

Referring to FIGS. 1D to 4D, after the first bit line structures 110 are formed, an insulating layer 114 is formed in the grooves 113 to cover the first bit line structures 110. In other words, the plurality of deep trenches 104 located in the region R2 are filled by the insulating layer 111, the first bit line structures 110, and the insulating layer 114. The method of forming the insulating layer 114 may be blanketly forming an insulating material layer and then performing a planarizing process on the insulating material layer. For example, a chemical mechanical polishing (CMP) process is performed such that the top surface of the insulating layer 114 is coplanar with the top surface of the insulating layer 112, but the invention is not limited thereto. The material of the insulating layer 114 is, for example, silicon nitride, and the forming method thereof includes CVD.

Referring to FIGS. 1E to 4E, a portion of the insulating layers 114, 112, and 111 and a portion of the substrate 100 are removed by a lithography and etching process to form second shallow trenches 106. The second shallow trenches 106 are extended through the plurality of active regions AA and the region R2 along the second direction D2 to divide the substrate 100 of each of the active regions AA into two pillar structures 120 (120a and 120b). In particular, the second shallow trench 106 between the two pillar structures 120a and 120b may also be referred to as a recessed region R. In some embodiments, the recessed region R may be passing through a centerline C of the active regions AA, such that the widths of the pillar structures 120a and 120b are the same.

In the active regions AA, the bottom surface of the recessed region R exposes the surface of the substrate 100. In the region R2, the bottom surface of the second shallow trenches 106 exposes the conductive layer 110b of the first bit line structures 110 and the remaining insulating layers 111 and 114. In some embodiments, the bottom surface of the recessed region R is substantially coplanar with the top surface of the first bit line structures 110 (e.g., the conductive layer 110b) located in the region R2.

Next, an insulating material layer 16 and a hard mask 115 are sequentially formed in the recessed region R. The insulating material layer 16 is conformally formed on the surface of the recessed region R, the hard mask 115 is located on the insulating material layer 16, and the top surface of the hard mask 115 is lower than the top surface of the insulating material layer 16. The hard mask 115 is different in material from the insulating material layer 16. For example, the material of the insulating material layer 16 includes silicon oxide or silicon nitride; the material of the hard mask 115 includes carbon. In some embodiments, the steps of forming the insulating material layer 16 and the hard mask 115 are illustrated as follows. An insulating material layer and a hard mask material layer are formed on the substrate 100, and then etchback is performed to form the insulating material layer 16 and the hard mask 115.

Referring to FIGS. 1F to 4F, the insulating material layer 16 not covered by the hard mask 115 is removed via a wet etching process by using the hard mask 115 as mask to form the insulating layer 116. The insulating layer 116 may only cover on the bottom surface of the recessed region R. Thereafter, an ashing process is performed to remove the hard mask 115 to expose the insulating layer 116. In some embodiments, after the above process is performed, a portion of the insulating layer 112 is etched to make it thinner.

Thereafter, a plurality of second bit line structures 130 are formed at the bottom of each of the second shallow trenches 106. Two adjacent second bit line structures 130 expose a top surface S1 of the insulating layer 111 located in the region R2. The second bit line structures 130 may include a barrier layer 130a and a conductive layer 130b. The material of the second bit line structures 130 may be similar to the material of the first bit line structures 110, and details are not repeated herein. In some embodiments, the second bit line structures 130 are formed as follows. A barrier material layer and a conductive material layer are formed on the substrate 100. Then, an etchback process is performed to leave the barrier material layer and the conductive material layer located at the bottom of the plurality of second shallow trenches 106. Thereafter, a lithography and etching process is performed to pattern the conductive material layer and the barrier material layer to form the barrier layer 130a and the conductive layer 130b, and expose the top surface S1 of the insulating layer 111 located in the plurality of deep trenches 104. The top surface S1 is located between two adjacent first bit line structures 110 arranged in the second direction D2, and the top surface S1 is lower than the top surface of the second bit line structures 130.

The second bit line structures 130 are located on the insulating layer 116 and extended along the second direction D2 to cover the first bit line structures 110 at two sides of the active regions AA to be electrically connected to the first bit line structures 110. Thereby, signals may be respectively transmitted to the second bit line structures 130 via the first bit line structures at two sides of the active regions AA to improve the ability of the memory to transmit signals.

Referring to FIGS. 1G to 4G, after the second bit line structures 130 are formed, a gate dielectric layer 140 is formed on a sidewall of the recessed region R. The material of the gate dielectric layer 140 may include silicon oxide, silicon oxynitride, and silicon nitride, and the forming method thereof includes, for example, CVD or in-situ steam generation (ISSG). The gate dielectric layer 140 may be formed by, for example, conformally forming an insulating material layer on the substrate 100 after the second bit line structures 130 are formed, and then performing an anisotropic etching process to form the gate dielectric layer 140 on the sidewall of the recessed region R.

Next, insulating structures 150 and word line structures 160 are sequentially formed in the second shallow trenches 106, and the top surface of the word line structure 160 is lower than the top surface of the pillar structure 120. That is, the word line structures 160 are located between the two pillar structures 120a and 120b of the active regions AA. The insulating structures 150 are disposed between the second bit line structures 130 and the word line structures 160. The material of the insulating structures 150 may include silicon oxide, silicon oxynitride, and silicon nitride, and the forming method thereof is, for example, CVD. The insulating structures 150 may be formed by, for example, forming an insulating material layer on the substrate 100, and then performing an etchback process. The word line structures 160 may include a barrier layer 160a and a conductive layer 160b. The material and forming method of the word line structures 160 may be similar to the material and forming method of the second bit line structures 130, and details are not repeated herein.

The word line structures 160 are extended along the second direction D2 and pass through the plurality of active regions AA arranged along the second direction D2 and the region R2 located between the active regions AA. Each of the word line structures 160 is disposed on and spaced apart from the plurality of second bit line structures 130, and the word line structures 160 are also located on the insulating layer 111 between two adjacent second bit line structures 130 arranged in the second direction D2. That is, the word line structures 160 and the second bit line structures 130 may be parallel to each other. In an embodiment, in the recessed region R, the vertical projection range of the word line structures 160 to the substrate 100 falls entirely within the vertical projection range of the second bit line structures 130 to the substrate 100.

Referring to FIGS. 1H to 4H, after the word line structures 160 are formed, an insulating structure 170 is formed on the word line structures 160. The material of the insulating structure 170 is, for example, silicon oxide formed by CVD. The method of forming the insulating structure 170 is, for example, forming an insulating material layer on the substrate 100, and then performing an etchback process or a CMP process until the top surfaces of the pillar structures 120 and the insulating layer 111 are exposed.

In an embodiment, the top surface of the insulating structure 170 is coplanar with the top surface of the pillar structure 120. The pillar structure 120 is a portion of the substrate 100, and the surfaces of the word line structures 160, the second bit line structures 130, and the first bit line structures 110 are all lower than the top surface of the pillar structure 120. In other words, the word line structures 160, the second bit line structures 130, and the first bit line structures 110 are all buried in the substrate 100.

After the insulating structure 170 is formed, an etching process is performed to remove the insulating layer 112 and a portion of the insulating layer 114 such that the insulating layer 114 is coplanar with the insulating layer 111. Then, a doping process is performed via ion implantation, diffusion doping, or other suitable methods to form a plurality of first doped regions 10 in the pillar structures 120 and a second doped region 20 located between the plurality of first doped regions 10. In an embodiment, the plurality of first doped regions 10 are disposed, for example, at the bottom and top of the pillar structure 120a and the pillar structure 120b. The first doped regions 10 may have a different conductivity type from the second doped region 20; the first doped regions 10 may have a different conductivity type from the substrate 100; and the second doped region 20 may have the same conductive type as the substrate 100. In an embodiment, the first doped regions 10 are, for example, N-type doped regions; and the second doped region 20 is, for example, a P-type doped region. The dopant in the N-type doped region may be phosphorus or arsenic; the dopant in the P-type doped region may be boron.

The first doped regions 10 located at the bottom of the pillar structures 120 are electrically connected to the second bit line structures 130. The first doped regions 10 located at the top of the pillar structures 120 are electrically connected to capacitor contact structures 180 subsequently formed.

The word line structures 160 on the active regions AA, the gate dielectric layer 140, and the first doped regions 10 and the second doped region 20 in the two pillar structures 120a and 120b together form one vertical transistor. The first doped regions 10 above and below the second doped region 20 are a source region and a drain region. A vertical channel CH may be formed in the second doped region 20 adjacent to the gate dielectric layer 140 by controlling the voltage applied to the word line structures 160. The direction of current flow in the vertical channel CH is substantially perpendicular to the direction of the surface of the substrate 100.

Referring to FIGS. 1I to 4I, after the plurality of first doped regions 10 and the second doped region 20 are formed, a plurality of capacitor contact structures 180 and a plurality of capacitors 190 are sequentially formed on the active regions AA of the substrate 100. The material of the capacitor contact structures 180 includes metal or metal alloy such as tungsten. The method of forming the capacitor contact structures 180 is, for example, forming a capacitor contact material layer and then performing a patterning process via lithography and etching. The capacitors 190 may be formed by a known method.

The capacitor contact structures 180 and the capacitors 190 are stacked vertically on a vertical transistor. Each of the capacitor contact structures 180 may be considered as a landing pad that is located on the insulating structure 170 of the active regions AA and the plurality of pillar structures 120. The capacitor contact structures 180 are electrically connected to the first doped regions 10 of the pillar structures 120. The area of the capacitor contact structures 180 projected on the substrate 100 is highly overlapped with the area of the active regions AA projected on the substrate 100, and the ratio range of the overlap thereof is, for example, 90% to 100%. Therefore, the capacitors 190 are more likely to land on the capacitor contact structures 180 to improve process margin.

The capacitors 190 are landed on the capacitor contact structures 180 and are in physical contact with and electrically connected to the capacitor contact structures 180. The area of the capacitors 190 projected on the substrate 100 may be highly overlapped with the area of the active regions AA projected on the substrate 100, and the ratio range of the overlap thereof is, for example, 70% to 78.5%. The capacitors 190 are electrically connected to the first doped regions 10 of the two pillar structures 120 of the active regions AA via the capacitor contact structures 180. By controlling the voltage applied to the word line structures 160, the channel CH may be formed in the second doped regions 20 at two sides of the word line structures 160 to charge the capacitors 190 via the capacitor contact structures 180.

The DRAM of the invention may achieve a cell size of $4F^2$, wherein F represents feature size. Furthermore, in an embodiment of the invention, via the configuration of the first bit line structures 110, the second bit line structures 130, the word line structures 160, and the plurality of pillar structures 120, most of the area of the active regions AA and even the area of the entire active regions AA may be used as the landing area of the capacitors 190 subsequently formed. Therefore, a larger capacitor landing area may be achieved while the size of the memory is reduced, which not only increases capacitance and improves efficiency, but also increases process window. In addition, the first doped regions 10 and the second doped region 20 of the vertical transistor are the pillar structures 120a and 120b formed at two sides of the word line structures 160, so that there are two separate channels CH in one active region AA. Via this method, electric field strength may be reduced, and gate-induced drain leakage (GIDL) may be alleviated, and thus the reliability of the DRAM may be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of manufacturing a dynamic random-access memory (DRAM), comprising:
   providing a substrate having a plurality of active regions;
   forming a plurality of first bit line structures buried in the substrate, wherein each of the plurality of first bit line structures is extended along a first direction, and every two of the plurality of first bit line structures are disposed between two neighboring ones of the plurality of active regions arranged along a second direction;
   forming a plurality of pillar structures arranged along the first direction by dividing each of the plurality of active regions;
   forming a plurality of second bit line structures, wherein each of the second bit line structures is located between the pillar structures of a corresponding one of the active regions and extended through the corresponding one of the active regions along the second direction to be disposed on the first bit line structures at two sides of the corresponding one of the active regions and be electrically connected to the first bit line structures below, wherein each of the plurality of pillar structures is electrically connected to a neighboring one of the plurality of second bit line structures; and
   forming a plurality of word line structures on and spaced apart from the second bit line structures, wherein each of the word line structures is located between the pillar structures of the corresponding one of the active regions and extended along the second direction to pass through the active regions arranged along the second direction.

2. The method of claim 1, wherein the forming a plurality of pillar structures comprises:
   forming a plurality of first doped regions disposed at a bottom and a top of each of the pillar structures, each of the plurality of first doped regions disposed at the bottom of each of the pillar structures is electrically connected to a neighboring one of the plurality of second bit line structures; and
   forming a second doped region disposed between the first doped regions.

3. The method of claim 1, further comprising forming a plurality of capacitor contact structures and a plurality of capacitors disposed on the active regions, wherein the capacitor contact structures are disposed between the capacitors and the active regions, and each of the capacitor contact structures is electrically connected to the pillar structures of the active region below.

4. The method of claim 3, further comprising:
forming a plurality of insulating layers formed on a bottom surface of a recessed region between the pillar structures to be located between the second bit line structures and the substrate;
forming a first insulating structure disposed between the second bit line structures and the word line structures;
forming a second insulating structure disposed between the word line structures and the capacitor contact structures; and
forming a gate dielectric layer located between the word line structures and the pillar structures.

5. The method of claim 4, further comprising performing a planarizing process so that a top surface of the first bit line structures is coplanar with the bottom surface of the recessed region.

6. A method of manufacturing a dynamic random-access memory (DRAM), comprising:
providing a substrate having an active region;
forming a plurality of first shallow trenches, a second shallow trench, and a plurality of deep trenches, wherein
the plurality of deep trenches respectively extend in a first direction and are located on a first side and a third side opposite to the first side of the active region;
the plurality of first shallow trenches respectively extend in the second direction and are located on the second and fourth sides opposite to the active area; and
the second shallow trenches are located in the active area and extends along the second direction to divide the active area into pillar structures;
forming a plurality of first bit line structures disposed in the plurality of deep trenches;
forming a second bit line structure disposed in the second shallow trench, wherein the second bit line structure is electrically connected to the plurality of first bit line structures; and
forming a word line structure disposed in the second shallow trench and on the second bit line structure, wherein the word line structure is spaced apart from the second bit line structure.

7. The method of claim 6, wherein the pillar structures comprise:
a plurality of first doped regions disposed at a bottom and a top of each of the pillar structures; and
a second doped region disposed between the first doped regions.

8. The method of claim 7, further comprising
forming a capacitor contact structure and a capacitor disposed over the active region, wherein the capacitor contact structure is disposed between the capacitor and the active region, and the capacitor contact structure is electrically connected to the pillar structures via the plurality of first doped regions disposed at the top of the pillar structures,
wherein the second bit line structure are electrically connected to the plurality of first doped regions disposed at the bottom of the pillar structures.

9. The method of claim 8, further comprising:
forming a first insulating structure disposed between the second bit line structure and the word line structure;
forming a second insulating structure disposed between the word line structure and the capacitor contact structure; and
a plurality of gate dielectric layers located between the word line structure and the pillar structures.

10. The method of claim 9, further comprising performing a planarizing process so that a top surface of the gate dielectric layer is coplanar with a top surface of the second insulating structure and top surfaces of the plurality of first doped regions disposed at the top of each of the pillar structures.

11. A method of manufacturing a DRAM, comprising:
forming a plurality of first shallow trenches and a plurality of deep trenches in a substrate to define a plurality of active regions, wherein each of the deep trenches is extended along a first direction, and each of the first shallow trenches is extended along a second direction;
forming a plurality of first bit line structures in the deep trenches;
forming a plurality of second shallow trenches in the active regions such that each of the active regions comprises a plurality of pillar structures located at two sides of each of the second shallow trenches, and the second shallow trenches and the first shallow trenches are alternately arranged along the first direction;
forming a plurality of second bit line structures in the second shallow trenches, wherein each of the second bit line structures is electrically connected to the first bit line structures at two sides of one of the active regions; and
forming a plurality of word line structures on the second bit line structures, wherein the word line structures are spaced apart from the second bit line structures.

12. The method of manufacturing the DRAM of claim 11, wherein the step of forming the first bit line structures comprises:
filling the first shallow trenches and the deep trenches via an insulating layer;
patterning the insulating layer to form a plurality of grooves in the deep trenches, wherein each of the grooves is extended along the first direction, and each of the grooves is arranged along the second direction; and
forming the first bit line structures in the grooves.

13. The method of manufacturing the DRAM of claim 12, wherein the step of forming the second bit line structures comprises:
forming a conductive material layer on the substrate and in the second shallow trenches;
etching back the conductive material layer; and
patterning the conductive material layer to expose a top surface of the insulating layer located in the deep trenches.

14. The method of manufacturing the DRAM of claim 11, further comprising:
after forming the word line structures, doping the pillar structures to form a plurality of first doped regions in each of the pillar structures and a second doped region located between the first doped regions.

15. The method of manufacturing the DRAM of claim 14, further comprising:
after forming the first doped regions and the second doped regions, forming a plurality of capacitor contact structures on the active regions, wherein each of the capacitor contact structures is electrically connected to the pillar structures in the active region below; and
forming a plurality of capacitors on the capacitor contact structures.

16. The method of manufacturing the DRAM of claim 15, further comprising:
- forming an insulating layer on a bottom surface of a recessed region between the pillar structures before forming the second bit line structures;
- forming a plurality of gate dielectric layers on a sidewall of the recess region and forming a plurality of first insulating structures on the second bit line structures before forming the word line structures; and
- forming a plurality of second insulating structures on the word line structures before forming the capacitors.

17. The method of manufacturing the DRAM of claim 16, wherein a top surface of the first bit line structures is coplanar with the bottom surface of the recessed region.

* * * * *